US009400303B2

(12) United States Patent
Choi

(10) Patent No.: US 9,400,303 B2
(45) Date of Patent: Jul. 26, 2016

(54) METHOD OF DETECTING STATE OF POWER CABLE IN INVERTER SYSTEM

(71) Applicant: LSIS CO., LTD., Anyang-si, Gyeonggi-do (KR)

(72) Inventor: Gi Young Choi, Seongnam-si (KR)

(73) Assignee: LSIS CO., LTD., Anyang-si (KR)

( * ) Notice: Subject to any disclaimer, the term of this patent is extended or adjusted under 35 U.S.C. 154(b) by 185 days.

(21) Appl. No.: 14/190,963

(22) Filed: Feb. 26, 2014

(65) Prior Publication Data

US 2014/0340097 A1 Nov. 20, 2014

(30) Foreign Application Priority Data

May 20, 2013 (KR) ........................ 10-2013-0056762

(51) Int. Cl.
*G01R 31/02* (2006.01)
*H02H 3/28* (2006.01)
*B60L 3/00* (2006.01)
*B60L 3/04* (2006.01)
*B60L 11/18* (2006.01)
(Continued)

(52) U.S. Cl.
CPC .............. *G01R 31/026* (2013.01); *B60L 3/003* (2013.01); *B60L 3/0046* (2013.01); *B60L 3/0069* (2013.01); *B60L 3/04* (2013.01); *B60L 11/1803* (2013.01); *B60L 11/1864* (2013.01); *B60L 15/007* (2013.01); *H02H 3/28* (2013.01); *H02H 5/10* (2013.01); *B60L 2240/547* (2013.01); *B60L 2240/549* (2013.01); *H02H 7/122* (2013.01); *H02M 7/5387* (2013.01); *H02M 2001/322* (2013.01); *Y02T 10/645* (2013.01); *Y02T 10/7005* (2013.01); *Y02T 10/7061* (2013.01)

(58) Field of Classification Search
CPC ...................................................... G01R 31/026
See application file for complete search history.

(56) References Cited

U.S. PATENT DOCUMENTS 6,452,340 B1 * 9/2002 Morrissey, Jr. ........ H05B 37/03
315/119
2008/0197810 A1 8/2008 Ishikawa et al.
(Continued)

FOREIGN PATENT DOCUMENTS

EP 1093205 4/2001
EP 2012338 1/2009
(Continued)

OTHER PUBLICATIONS

Japan Patent Office Application Serial No. 2014-054602, Office Action dated Mar. 20, 2015, 5 pages.
(Continued)

*Primary Examiner* — Tung X Nguyen
*Assistant Examiner* — Feba Pothen
(74) *Attorney, Agent, or Firm* — Lee Hong Degerman Kang & Waimey; Jonathan Kang; Jeffrey Lotspeich

(57) ABSTRACT

Provided is a method of detecting a state of a power cable in an inverter system. The method includes detecting a direct current (DC)-link voltage value of a DC-link capacitor included in an inverter, detecting a battery voltage value of a battery supplying a DC power to the inverter, comparing the DC-link voltage value with the battery voltage value, and determining the state of the power cable connecting the inverter to the battery to be abnormal when a difference between the DC-link voltage value and the battery voltage value is out of a preset range.

7 Claims, 5 Drawing Sheets

(51) Int. Cl.
*B60L 15/00* (2006.01)
*H02H 5/10* (2006.01)
*H02H 7/122* (2006.01)
*H02M 1/32* (2007.01)
*H02M 7/5387* (2007.01)

(56) References Cited

U.S. PATENT DOCUMENTS

| | | | |
|---|---|---|---|
| 2009/0228163 A1 | 9/2009 | Tarchinski | |
| 2009/0230909 A1* | 9/2009 | Hiti | H02P 21/0003 318/564 |
| 2009/0243556 A1* | 10/2009 | Lu | G01R 31/3651 320/162 |
| 2009/0295224 A1 | 12/2009 | Kobayashi et al. | |
| 2010/0185405 A1* | 7/2010 | Aoshima | B60L 3/0046 702/63 |
| 2013/0106423 A1* | 5/2013 | Moon | H02H 3/044 324/418 |
| 2014/0188315 A1* | 7/2014 | Kang | G07C 5/00 701/22 |

FOREIGN PATENT DOCUMENTS

| | | |
|---|---|---|
| JP | 2002-291149 | 10/2002 |
| JP | 2003-102101 | 4/2003 |
| JP | 2005-117861 | 4/2005 |
| JP | 2006-129567 | 5/2006 |
| KR | 10-2009-0109373 | 10/2009 |

OTHER PUBLICATIONS

European Patent Office Application Serial No. 14159746.8, Search Report dated Sep. 19, 2014, 6 pages.
Korean Intellectual Property Office Application Serial No. 10-2013-0056762, Notice of Allowance dated Sep. 29, 2014, 2 pages.

* cited by examiner

METHOD OF DETECTING STATE OF POWER CABLE IN INVERTER SYSTEM

CROSS-REFERENCE TO RELATED APPLICATIONS

Pursuant to 35 U.S.C. §119(a), this application claims the benefit of earlier filing date and right of priority to Korean Application No. 10-2013-0056762, filed on May 20, 2013, the contents of which is incorporated by reference herein in its entirety.

BACKGROUND

The present disclosure relates to an inverter system, and more particularly, to a method of detecting a state of a power cable in an inverter system capable of detecting the state of the power cable and forcibly discharging residual energy in a direct current (DC)-link capacitor when a disconnection occurs.

Inverter systems are electric/electronic sub assemblies (ESAs) converting a high voltage direct current (DC) power into an alternating current (AC) or a DC power and are primary components included in electric motors of vehicles.

Motors applied as driving units to echo-friendly vehicles are driven by phase currents transferred through a first high voltage power cable from an inverter converting a DC current into a three-phase voltage according to a pulse width modulation (PWM) signal of a controller.

Also, the inverter converts a DC link voltage transferred through a second high voltage power cable by opening and closing of a main relay into a three-phase voltage.

Accordingly, when any one of the first power cable connecting the inverter to the motor and the second power cable connecting a high voltage battery to the inverter is separated, the motor is not smoothly driven and a high voltage/high current is left to an inverter system, thereby causing a fatal error damaging the entire inverter system.

FIG. 1 is a diagram of a general apparatus for detecting a separation of a power cable in an inverter system.

Referring to FIG. 1, the apparatus includes a power cable 10, a connector 20, and a sensor 30 formed between the power cable 10 and the connector 20 and transmitting a signal according to a separation between the power cable 10 and the connector 20.

The sensor 30 is connected to a contact portion between the power cable 10 and the connector 20 and transmits a digital signal to a controller according to whether the power cable 10 is connected to the connector 20.

That is, in general, a sensor for checking whether the power cable 10 is separated is additionally installed in an aspect of hardware in one of the power cable 10 and the connector 20. It is checked using a digital signal outputted from the sensor in real time whether the power cable 10 is separated.

However, since the apparatus for detecting the separation of the power cable only detects whether the power cable is separated in the aspect of hardware, there are limitations in price and space.

Also, the apparatus for detecting the separation of the power cable may easily misoperate due to an external cause such as vibrations, etc., which causes a danger in safety of a driver.

In an inverter system for an electric automobile, when a power cable is disconnected or a connector is unfastened due to vibrations and external causes while driving or stopping, it is impossible to check a state of a high voltage cable or an electric contact point is exposed to make the state unstable, which includes dangers. Accordingly, it is necessary to safely stop a vehicle by rapidly detecting the disconnection and unfastening.

Also, when the power cable is disconnected and the connector is unfastened, a worker or a driver accesses the vehicle while a DC-link capacitor is being charged, which leads to a big accident.

SUMMARY

Embodiments provide a method of detecting a state of a power cable in an inverter system, capable of detecting the state of the power cable in an aspect of software without additional hardware and allowing a vehicle to safely stop by using a proper forcible discharge logic when the power cable becomes abnormal.

Additional aspects will be set forth in part in the description which follows and, in part, will be apparent from the description, or may be learned by practice of the presented embodiments.

In one embodiment, a method of detecting a state of a power cable in an inverter system includes detecting a direct current (DC)-link voltage value of a DC-link capacitor included in an inverter, detecting a battery voltage value of a battery supplying a DC power to the inverter, comparing the DC-link voltage value with the battery voltage value, and determining the state of the power cable connecting the inverter to the battery to be abnormal when a difference between the DC-link voltage value and the battery voltage value is out of a preset range.

The method may further include checking a state of a main relay formed between the inverter and battery and controlling the DC power supplied to the inverter. In this case, the determining of the state of the power cable may be performed when the state of the main relay is "on".

The detecting of the battery voltage value may further include receiving the battery voltage value from a first electronic control unit, and the first electronic control unit may be one of a battery management system (BMS) and a low voltage DC-DC converter (LDC).

The method may further include determining whether the received battery voltage value is valid, and the comparing the DC-link voltage value with the battery voltage value may be performed when the battery voltage value is valid.

The method may further include, when the battery voltage value is not valid, receiving the battery voltage value from a second electronic control unit. In this case, the second electronic control unit may be one of the BMS and the LDC, different from the first electronic control unit.

The method may further include, when the received battery voltage value is not valid, detecting the state of the power cable by using the detected DC-link voltage value and a preset low voltage trip level.

The detecting of the state of the power cable by using the detected DC-link voltage value and the preset low voltage trip level may include comparing a result value of multiplying the low voltage trip level by a value present between 0 and 1 with the DC-link voltage value and determining the state of the power cable to be abnormal when the DC-link voltage value is smaller than the result value.

The method may further include, when the state of the power cable is determined to be abnormal, forcibly discharging energy stored in the DC-link capacitor.

The forcibly discharging the energy may include determining whether a current of the inverter is controllable, forcibly discharging the DC-link capacitor by using a d-axis current reference value of a synchronous reference frame when the current is controllable, and forcibly discharging the DC-link capacitor by using a d-axis current reference value of one of the synchronous reference frame or a stationary reference frame when the current is uncontrollable.

In another embodiment, a method of detecting a state of a power cable in an inverter system includes detecting a DC-link voltage value of a DC-link capacitor included in an inverter, comparing the detected DC-link voltage value with a preset low voltage trip level, determining the state of the power cable connecting the inverter to a battery to be abnormal when the DC-link voltage value is smaller than the low voltage trip level, and forcibly discharging energy stored in the DC-link capacitor when the state of the power cable is abnormal.

The comparing of the detected DC-link voltage value with the preset low voltage trip level may include multiplying the low voltage trip level by a value present between 0 and 1 and comparing a result value of the multiplying with the DC-link voltage value.

The method may further include detecting the state of the power cable according to whether a battery voltage value received from an electronic control unit and the DC-link voltage value exceed a preset range. In this case, the electronic control unit may be at least one of a BMS and an LDC.

According to the embodiments, when a DC-link cable is disconnected and a connector is unfastened, such abnormality may be detected without additional hardware while driving a vehicle. Also, when it is determined that a disorder occurs, a vehicle may be allowed to safely stop using a proper forcible discharge logic, thereby improving the safety of a driver.

The details of one or more embodiments are set forth in the accompanying drawings and the description below. Other features will be apparent from the description and drawings, and from the claims.

DETAILED DESCRIPTION OF THE EMBODIMENTS

Following contents merely illustrate a principle of embodiments. Accordingly, one of ordinary skill in the art, although not being clearly described or shown in the specification, may made various apparatuses embodying the principle and included in the concepts and scope of the embodiments. Also, all conditional terms and embodiments described herein are described basically to allow the concepts of the embodiments to be clearly understood but do not limit the same.

Also, not only the principle, viewpoint, and embodiments, but also all detailed descriptions of exemplary embodiments will be understood to include structural and functional equivalents thereof. Also, it will be understood that the equivalents include not only presently known equivalents but also equivalents developable in the future, that is, all devices made to perform identical functions regardless of structures thereof.

Figure 1:
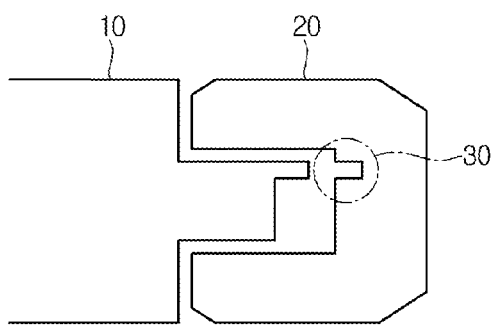
FIG. 1 is a diagram of a general apparatus for detecting a separation of a power cable in an inverter system.
Figure 2:
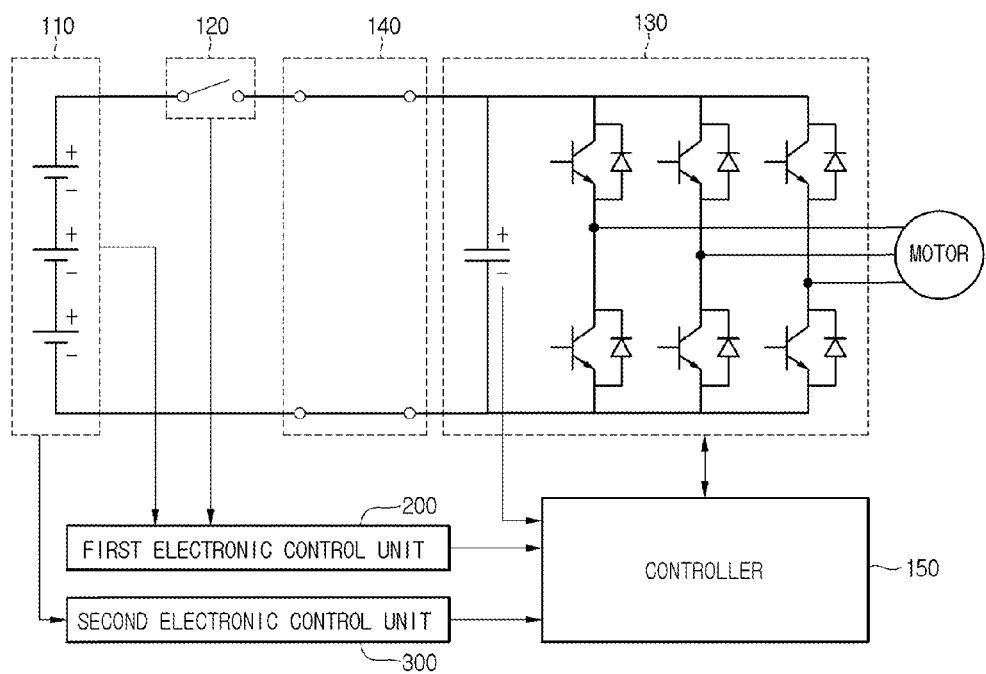
FIG. 2 is a configuration diagram of an inverter system according to an embodiment.

FIG. 2 is a configuration diagram of an inverter system according to an embodiment.

Referring to FIG. 2, the inverter system includes a battery 110, a main relay 120, an inverter 130, a power cable 140, a controller 150, a first electronic control unit 200, and a second electronic control unit 300.

The battery 110 supplies a driving power to an electrically driven mobile object, for example, an electric automobile.

Particularly, the battery 110 supplies a direct current (DC) power to a DC-link capacitor included in the inverter 130.

The battery 110 is a high voltage battery and may be formed of a set of a plurality of unit cells.

The plurality of unit cells, in order to maintain a certain voltage, may be managed by an electronic control unit, for example, a battery management system (BMS) and may emit a certain DC power under the control of the electronic control unit.

Also, the electronic control unit may detect a voltage of the battery 110 and may transfer the voltage to the controller 150 that will be described later. The electronic control unit will be described below in detail.

The battery 110 may be formed of a secondary battery changeable into a charged state and a discharged state according to an operation state.

The main relay 120 is disposed on a certain power line connected to the battery 110 and controls a DC power outputted through the battery 110.

In FIG. 2, there is only one main relay disposed on the power line. However, it is just an example and the number of the main relays 120 disposed thereon may increase.

For example, the main relay 120 may include a first main relay connected to a positive terminal and controlling the DC power and a second main relay connected to a negative terminal and controlling the DC power.

The inverter 130 receives the DC power from the battery 110 according to a switching state of the main relay 120.

Also, the inverter 130 converts the DC power supplied from the battery 110 into an alternating current (AC) power and supplies the AC power to a motor.

In this case, the AC power converted by the inverter 130 may be a three-phase AC power.

Particularly, the inverter 130 is formed of an insulated gate bipolar transistor (IGBT) and allows the motor to drive by phase-converting the DC power supplied from the battery 110 by pulse width modulation (PWM) switching according to a control signal applied from the controller 150.

The motor includes a stator (not shown), which does not rotate and is fixed, and a rotator (not shown), which rotates. The motor receives the AC power supplied through the inverter 130.

The motor, for example, may be a three-phase motor. When respective phase AC powers having variable voltages and frequencies are applied to coils of stators of respective phases, a rotation speed of the rotator may vary with the applied frequency.

The motor may be various such as an induction motor, a blushless DC (BLDC) motor, and a reluctance motor.

On the other hand, a driving gear (not shown) may be provided on one side of the motor. The driving gear converts rotational energy of the motor according to a gear ratio. The rotational energy outputted from the driving gear is transmitted to front wheels and/or rear wheels to allow the electric automobile to move.

On the other hand, not shown in FIG. 2, the electric automobile may further include an electronic controller for controlling overall electronic devices of the electronic automobile. The electronic controller may control to allow the respective devices to operate, display, etc. Also, the electronic control unit may control the BMS.

Also, the electronic controller may generate driving references according to various driving modes such as a driving mode, a reverse mode, a neutral mode, and a parking mode based on sensing signals from a tilt angle sensor (not shown) sensing a tilt angle of the electric automobile, a velocity sensor (not shown) sensing velocity of the electric automobile, a brake sensor (not shown) sensing operations of a brake pedal, and an accelerator sensor (not shown) sensing operations of an accelerator pedal. The driving reference may be, for example, a torque reference or a velocity reference.

On the other hand, the electric automobile may include not only all electric automobiles using a battery and a motor but also hybrid electric vehicles using a battery and a motor while using an engine.

Herein, a hybrid electric vehicle may further include a transfer system capable of selecting any one of the battery and the engine and a transmission. On the other hand, the hybrid electric vehicles may be divided into a serial system, in which mechanical energy outputted from an engine is converted into electric energy to drive a motor, and a parallel system, in which mechanical energy outputted by en engine and electric energy outputted by a battery are used at the same time.

The controller 150 controls overall operations of the inverter 130.

For example, the controller 150 calculates a drive value for driving the motor by using a current supplied to the motor and generates a switching signal, which is a PWM signal, for controlling the inverter 130 according to the calculated drive value.

Accordingly, the inverter 130 converts the DC power into the AC power by selectively performing on-off operations according to the switching signal generated by the controller 150.

On the other hand, the controller 150 determines a state of the power cable 140 connecting the battery 110 to the inverter 130 according to a state of the DC power supplied to the inverter 130 and controls operations of the inverter 130 according to the state of the power cable 140.

The power cable 140 is connected to both a positive terminal + and a negative terminal − of the battery 110, respectively, and provides the inverter 130 with the DC power supplied from the battery 110 connected thereto.

In this case, when a problem occurs in the power cable 140, for example, a disconnection, unfastening, and separation of a cable, the inverter 130 does not receive a normal DC power, thereby causing a problem in driving the motor.

According thereto, the controller 150 detects the state of the power cable 140 and when the state of the power cable 140 is abnormal, cuts off power supplied to the inverter 130 and the motor.

A method of detecting the state of the power cable 140, performed by the controller 150, will be described below in detail.

The first electronic control unit 200 and the second electronic control unit 300 obtain information for detecting the state of the power cable 140 and transmit the obtained information to the controller 150.

In this case, the first electronic control unit 200 may be a BMS and the second electronic control unit 300 may be a low voltage DC-DC converter (LDC).

The BMS is for managing overall operations of the battery 110, for example, may allow a plurality of unit cells forming the battery 110 to maintain a uniform voltage.

Also, the BMS may allow a voltage charged in the battery 110 to be supplied to the inverter 130 through the main relay 120 and the power cable 140.

The BMS manages an overall state of the battery 110 and obtains state information of the battery 110, for example, a temperature, a voltage, a current, a state of charge, etc. of the battery 110.

The LDC is a DC-DC converter rectifying the power of the battery 110 to be a DC power, in which a general DC power is switched into an AC power and the AC power is raised or dropped in voltage thereof by using a coil, a transistor, and a capacitor and is rectified into a DC power, thereby supplying electricity suitable for a voltage used in respective electric field loads.

The first electronic control unit 200 controls not only the battery 110 but also a switching state of the main relay 120.

According thereto, the first electronic control unit 200 recognizes information of the battery 110 and state information of the main relay 120 and transmit the battery information and the main relay information to the controller 150.

The first electronic control unit 200 and the controller 150, actually, an inverter mutually exchange information through controller area network (CAN) communication.

That is, the controller 150 receives information on a voltage of the battery 110 and the switching state of the main relay 120 from the first electronic control unit 200.

On the other hand, the second electronic control unit 300 may also recognize the information of the battery 110 such as a battery voltage and may transmit the information on the battery voltage to the controller 150.

The second electronic control unit 300 and the controller 150, actually, the inverter also mutually exchange information through the controller area network (CAN) communication.

Hereinafter, an operation of detecting the state of a power cable, performed by the controller 150, and forcible discharge logic performed when the power cable is abnormal will be described with reference to the attached drawings.

Figure 3:
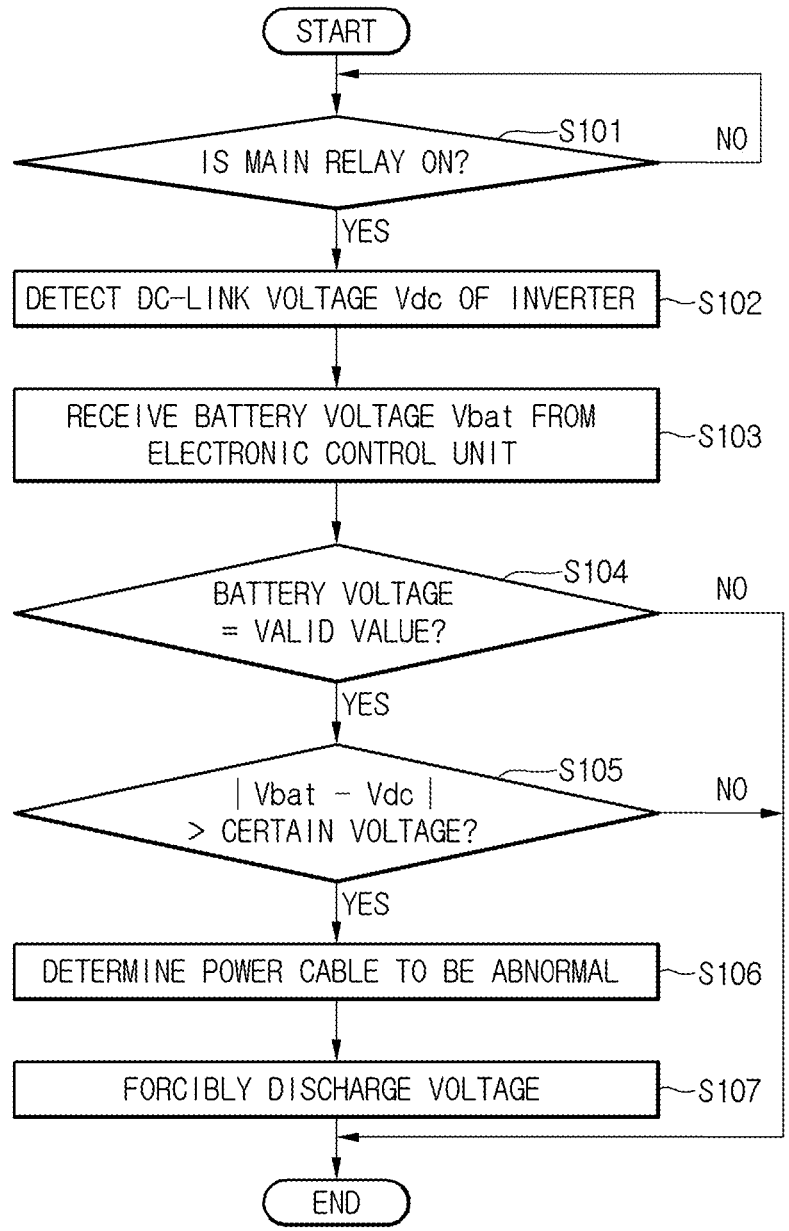
FIG. 3 is a flowchart illustrating operations of a method of detecting a state of a power cable in an inverter system according to another embodiment.
Figure 4:
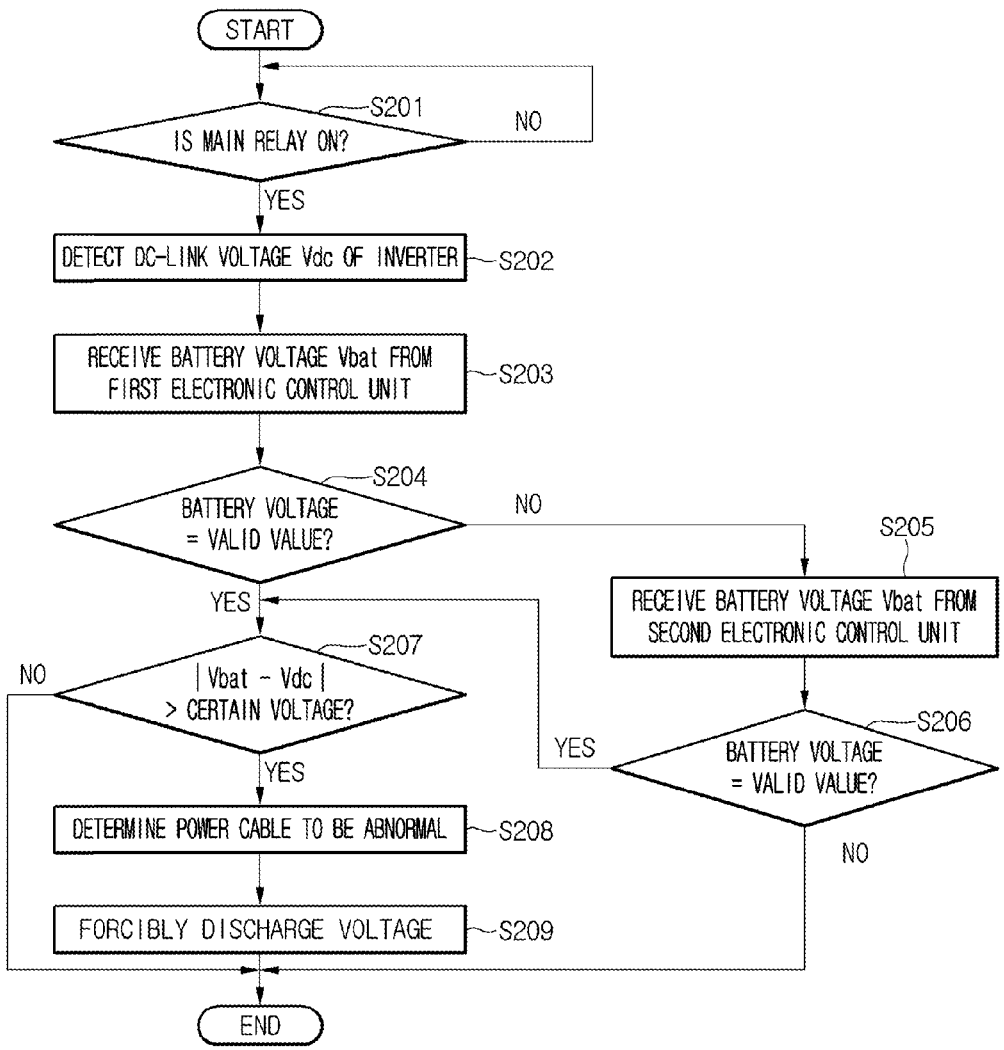
FIG. 4 is a flowchart illustrating operations of a method of detecting a state of a power cable in an inverter system according to still another embodiment.
Figure 5:
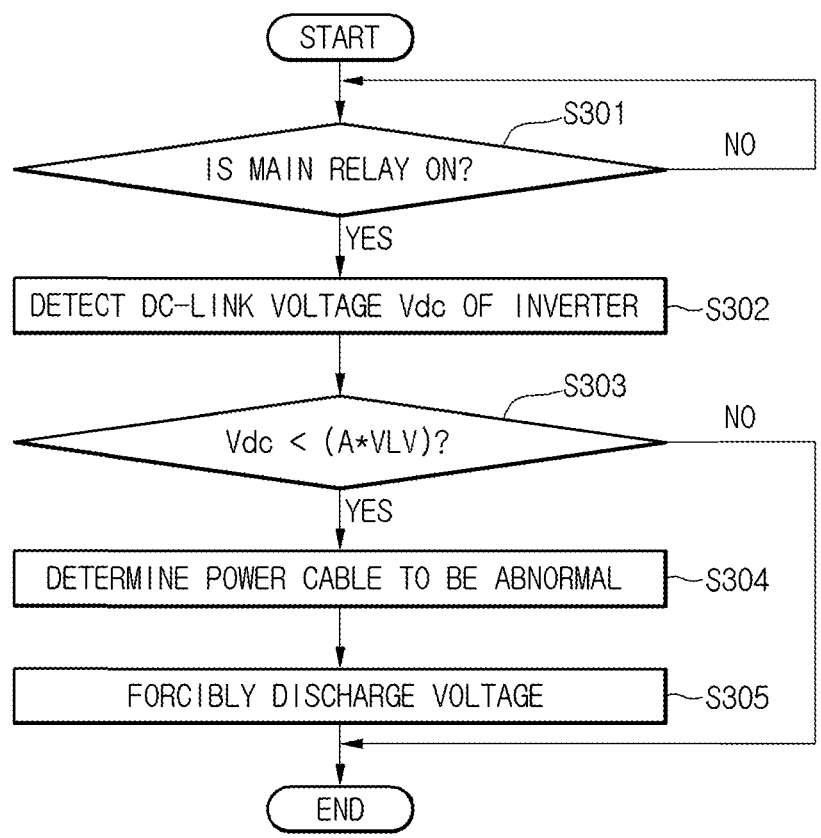
FIG. 5 is a flowchart illustrating operations of a method of detecting a state of a power cable in an inverter system according to even another embodiment.
Figure 6:
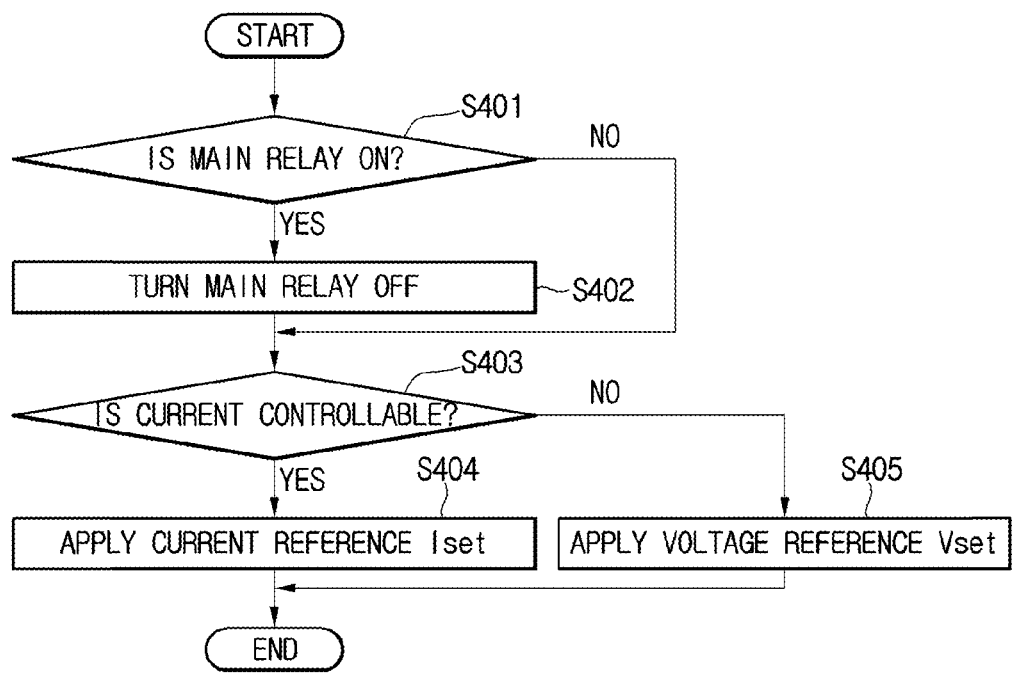
FIG. 6 is a flowchart illustrating operations of a forcible discharge logic in an inverter system according to yet another embodiment.

FIG. 3 is a flowchart illustrating operations of a method of detecting the state of the power cable 140 in the inverter system according to another embodiment, FIG. 4 is a flowchart illustrating operations of a method of detecting the state of the power cable 140 in the inverter system according to still another embodiment, FIG. 5 is a flowchart illustrating operations of a method of detecting the state of the power cable 140 in the inverter system according to even another embodiment, and FIG. 6 is a flowchart illustrating operations of forcible discharge logic in the inverter system according to yet another embodiment.

Hereinafter, in association with the components shown in FIG. 2, contents illustrated in FIGS. 3 to 6 will be described.

Referring to FIG. 3, the controller 150 obtains switching state information of the main relay 120 (S101). That is, the controller 150 checks whether the main relay 120 is in an on state or an off state at present.

After that, as a result of the determining of operation S101, when a switching state of the main relay 120 is "on", the controller 150 detects a DC-link voltage Vdc of the inverter 130 (S102). In other words, the controller 150 detects a voltage applied to a capacitor C included in the inverter 130.

Also, the controller 150 receives information related to the battery 110, in detail, a voltage Vbat of the battery 110 from an electronic control unit (S103). In this case, the electronic control unit may be a BMS or an LDC.

The controller 150, when the battery voltage Vbat is received, determines whether the received battery voltage Vbat is a valid value (S104). That is, the controller 150 determines whether the battery voltage Vbat is a value included within a preset normal range.

This is, when the electronic control unit abnormally operates due to a disorder of the inverter system, a wrong battery voltage Vbat may be transmitted from the electronic control unit. According thereto, in the embodiment, only when a transmitted value of the battery voltage Vbat is present within a physically available range, the state of the power cable 140 is selectively detected.

When the battery voltage Vbat is the valid value, the controller 150 determines whether an absolute value of a difference between the obtained DC-link voltage Vdc and the battery voltage Vbat is greater than a preset certain voltage (S105).

In other words, the controller 150 determines whether the difference between the DC-link voltage Vdc and the battery voltage Vbat exceeds a normal range condition.

After that, when the difference between the DC-link voltage Vdc and the battery voltage Vbat exceeds the normal range condition, the controller 150 determines that the power cable 140 is abnormally connected (S106).

Also, the controller 150 executes the forcible discharge logic against an abnormal state of the power cable 140 and discharges a voltage left in the capacitor C (S107).

The forcible discharge logic will be described below in detail with reference to FIG. 6.

As described above, in the embodiment, the state of the power cable 140 may be easily detected by comparing the battery voltage Vbat provided from the electronic control unit with the DC-link voltage Vdc detected by the inverter 130.

On the other hand, in the above, when the battery voltage Vbat is not a valid value, the state of the power cable 140 may be detected using the method shown in FIG. 5. Before using the method of FIG. 5, the method shown in FIG. 4 may be used.

Referring to FIG. 4, the controller 150 obtains switching state information of the main relay 120 (S201). That is, the controller 150 checks whether the main relay 120 is in an on state or an off state at present.

After that, as a result of the determining of operation S201, when a switching state of the main relay 120 is "on", the controller 150 detects a DC-link voltage Vdc of the inverter 130 (S202). In other words, the controller 150 detects a voltage applied to the capacitor C included in the inverter 130.

Also, the controller 150 receives information related to the battery 110, in detail, a voltage Vbat of the battery 110 from a first electronic control unit (S203). In this case, the first electronic control unit may be any one of a BMS and an LDC.

The controller 150, when the battery voltage Vbat is received, determines whether the received battery voltage Vbat is a valid value (S204). That is, the controller 150 determines whether the battery voltage Vbat is a value included within a preset normal range.

This is, when the first electronic control unit abnormally operates due to a disorder of the inverter system, a wrong battery voltage Vbat may be transmitted from the first electronic control unit. According thereto, in the embodiment, only when a transmitted value of the battery voltage Vbat is present within a physically available range, the state of the power cable 140 is selectively detected.

When the battery voltage Vbat is not a valid value, the controller 150 receives the battery voltage Vbat from a second electronic control unit (S205).

After that, the controller 150 determines whether the battery voltage Vbat received from the second electronic control unit is a valid value (S206). In this case, when all the battery voltages Vbat received from the first and second electronic control units are not valid values, since being not normally performed, the operation of detecting the state of the power cable 140 may be finished. The method of FIG. 5 may be allowed to be used.

Also, when any one of the battery voltages Vbat received from the first and second electronic control units is a valid value, the controller 150 determines whether an absolute value of a difference between the obtained DC-link voltage Vdc and the battery voltage Vbat is greater than a preset certain voltage (S207).

In other words, the controller 150 determines whether the difference between the DC-link voltage Vdc and the battery voltage Vbat exceeds a normal range condition.

After that, when the difference between the DC-link voltage Vdc and the battery voltage Vbat exceeds the normal range condition, the controller 150 determines that the power cable 140 is abnormally connected (S208).

Also, the controller 150 executes the forcible discharge logic against an abnormal state of the power cable 140 and discharges a voltage left in the capacitor C (S209).

As described above, in the embodiment, the reliability of the operation of detecting the state of the power cable 140 may increase by receiving battery voltages Vbat provided from a plurality of electronic control units.

Referring to FIG. 5, the controller 150 obtains switching state information of the main relay 120 (S301). That is, the controller 150 checks whether the main relay 120 is in an on state or an off state at present.

After that, as a result of the determining of operation S301, when a switching state of the main relay 120 is "on", the controller 150 detects a DC-link voltage Vdc of the inverter 130 (S302). In other words, the controller 150 detects a voltage applied to the capacitor C included in the inverter 130.

After that, the controller 150 compares the detected DC-link voltage Vdc with a preset low voltage trip level VLV with respect to a DC-link of the inverter 130 (S303). In this case, the controller 150 compares a result value obtained by multiplying the low voltage trip level VLV by a value A having a range from 0 to 1 with the DC-link voltage Vdc. Generally, in an inverter, a DC-link capacitor is present and a circuit for measuring a voltage of the DC-link capacitor is provided. The inverter is allowed to output a PWM voltage by using the measured voltage. In this case, since a distorted voltage may be outputted when the measured voltage is low, in order to control with a desired degree of precision, a low voltage trip level with respect to the voltage is to be set.

That is, the result value is smaller than the low voltage trip level VLV and the controller 150 determines whether the DC-link voltage Vdc is lower than the value smaller than the low voltage trip level VLV.

After that, the controller 150, when the DC-link voltage is smaller than the result value, determines that the power cable 140 is abnormal (S304) and accordingly executes the forcible discharge logic (S305).

Referring to FIG. 6, the controller 150, when an abnormal state of the power cable 140 is detected by using the method described above, checks a state of the main relay 120 (S401). The controller 150 may determine whether the state of the main relay 120 is an on state.

After that, the controller 150, when the state of the main relay 120 is the on state, changes the state of the main relay 120 into an off state (S402).

After that, the controller 150 determines whether a current of the inverter 130 is controllable (S403). That is, the controller 150 determines whether an IGBT included in the inverter 130 is able to normally operate or unable due to a disorder of a sensor, etc.

After that, when the current of the inverter 130 is controllable, the controller 150 generates a d-axis current reference value of a synchronous reference frame and forcibly discharges a voltage stored in the DC-link capacitor (S404). The synchronous reference frame is a reference frame viewed from an axis of a magnetic flux formed by a rotator.

On the other hand, when the current is uncontrollable, the controller 150 generates a d-axis current reference value of one of the synchronous reference frame and a stationary reference frame and forcibly discharges the voltage stored in the DC-link capacitor (S405).

According to the embodiments, when a DC-link cable is disconnected and a connector is unfastened, a corresponding abnormality may be detected without additional hardware. When a disorder occurs, a vehicle may be allowed to stop through forcible discharge logic, thereby improving the safety of a driver.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of detecting a state of a power cable in an inverter system, the method comprising:
   detecting a direct current (DC)-link voltage value of a DC-link capacitor included in an inverter;
   receiving a first battery voltage value from a first electronic control unit;
   determining whether the first battery voltage value is a value included within a preset normal range;
   receiving a second battery voltage value from a second electronic control unit when the first battery voltage value is not the value included within the preset normal range,
   determining whether the second battery voltage value is the value included within the preset normal range;
   detecting a preset low voltage trip level when the second battery voltage value is not the value included within the preset normal range,
   comparing the DC-link voltage value with a reference value; and
   determining the state of the power cable connecting the inverter based on a result of the comparing,
   wherein the reference value is the first battery voltage value when the first battery voltage value is the value included within the preset normal range,
   wherein the reference value is the first battery voltage value when the second battery voltage value is the value included within the preset normal range,
   wherein the reference value is the preset low voltage trip level when all the first battery voltage value and the second battery voltage value are not the values included within the preset normal range,
   wherein the first electronic control unit is one of a battery management system (BMS) or a low voltage DC-DC converter (LDC),
   wherein the second electronic control unit is one of a BMS or an LDC, different from the first electronic control unit.

2. The method of claim 1, further comprising checking a state of a main relay formed between the inverter and a battery and controlling DC power supplied to the inverter,
   wherein the determining of the state of the power cable is performed when the state of the main relay is "on".

3. The method of claim 1, wherein the determining of the state of the power cable comprises:
   determining the state of the power cable to be abnormal when a difference between the DC link voltage value and the first battery voltage value is out of a preset range.

4. The method of claim 3, wherein the determining of the state of the power cable comprises:
   determining the state of the power cable to be abnormal when a difference between the DC link voltage value and the second battery voltage value is out of a preset range.

5. The method of claim 4, wherein the determining of the state of the power cable comprises:
   comparing a result value of multiplying the low voltage trip level by a value present between 0 and 1 with the DC-link voltage value; and
   determining the state of the power cable to be abnormal when the DC-link voltage value is smaller than the result value.

6. The method of claim 1, further comprising, when the state of the power cable is determined to be abnormal, forcibly discharging energy stored in the DC-link capacitor.

7. The method of claim 6, wherein the forcibly discharging the energy comprises:
   determining whether a current of the inverter is controllable;
   forcibly discharging the DC-link capacitor by using a d-axis current reference value of a synchronous reference frame when the current is controllable; and
   forcibly discharging the DC-link capacitor by using a d-axis current reference value of one of the synchronous reference frame or a stationary reference frame when the current is not controllable.

* * * * *